US012677393B2

(12) United States Patent
Su et al.

(10) Patent No.: US 12,677,393 B2
(45) Date of Patent: Jul. 7, 2026

(54) FAN ASSEMBLY

(71) Applicant: PLUME DESIGN, INC., Palo Alto, CA (US)

(72) Inventors: Ming-Tsung Su, Taipei City (TW); Chun-Hung Liu, Taipei City (TW); Huang Yu Ting, Hsinchu City (TW); Yu-Han Liu, Taipei City (TW)

(73) Assignee: PLUME DESIGN, INC., Palo Alto, CA (US)

( * ) Notice: Subject to any disclaimer, the term of this patent is extended or adjusted under 35 U.S.C. 154(b) by 237 days.

(21) Appl. No.: 18/619,419

(22) Filed: Mar. 28, 2024

(65) Prior Publication Data

US 2025/0311143 A1     Oct. 2, 2025

(51) Int. Cl.
H05K 7/20 (2006.01)

(52) U.S. Cl.
CPC ..... H05K 7/20172 (2013.01); H05K 7/20154 (2013.01)

(58) Field of Classification Search
CPC ...... G06F 1/20; G06F 2200/201; G06F 1/206; H05K 7/20172; H05K 7/20154; H05K 7/20145; H05K 7/20209; H05K 1/0204; H05K 7/20409; H05K 2201/09054; H05K 2201/10416; H05K 7/20136; H05K 7/2039; H05K 7/20436; H05K 1/0203; H05K 1/181; H05K 2201/042; H05K 2201/10371; H05K 7/12; H05K 7/14; H05K 7/20; H05K 7/20509; H10W 40/60; H10W 90/736; H10W 40/641; H10W 40/43; F04D 29/4226; F04D 25/082; F04D 25/166; F04D 29/703; F04D 29/164; H02K 5/04; H02K 5/15; H02K 5/18; H02K 9/227; H02K 9/223; F16C 2360/46
See application file for complete search history.

(56) References Cited

U.S. PATENT DOCUMENTS

| | | | | |
|---|---|---|---|---|
| 5,689,404 | A * | 11/1997 | Katsui ................... | H10W 40/43 |
| | | | | 257/E23.105 |
| 6,241,007 | B1 * | 6/2001 | Kitahara .............. | H10W 40/43 |
| | | | | 361/689 |
| 6,400,053 | B1 * | 6/2002 | Horng ................... | H02K 1/187 |
| | | | | 310/67 R |
| 6,408,934 | B1 * | 6/2002 | Ishida ................. | F28D 15/0233 |
| | | | | 257/722 |
| 6,873,069 | B1 * | 3/2005 | Odagiri ................. | H10W 40/43 |
| | | | | 310/67 R |
| 10,285,303 | B2 * | 5/2019 | Williams ................. | H05K 7/20 |
| 10,948,240 | B2 * | 3/2021 | Hsieh ................. | F28D 15/0275 |
| 2002/0181200 | A1 * | 12/2002 | Chang ..................... | G06F 1/203 |
| | | | | 361/679.47 |

(Continued)

*Primary Examiner* — Michael A Matey
(74) *Attorney, Agent, or Firm* — Nicholas Martin; Greenberg Traurig, LLP

(57) ABSTRACT

Disclosed are embodiments for a fan assembly that includes: a housing, the housing defines a fan chamber; a base member including a first metallic layer located on a first side of the base member, a second metallic layer located on a second side of the base member, a channel extending through the base member, the channel places the first side in fluid communication with the second side, and the second metallic layer is joined to the first metallic layer; and a fan, the fan is coupled to the base member adjacent the second side at the channel.

19 Claims, 7 Drawing Sheets

100

(56) References Cited

U.S. PATENT DOCUMENTS

| | | | | |
|---|---|---|---|---|
| 2007/0240869 A1* | 10/2007 | Goto | .................. | G06F 1/203 |
| | | | | 165/185 |
| 2010/0139895 A1* | 6/2010 | Hwang | ................ | H10W 40/73 |
| | | | | 165/104.26 |
| 2011/0149504 A1* | 6/2011 | Wikander | .............. | G06F 1/203 |
| | | | | 415/177 |
| 2012/0114512 A1* | 5/2012 | Lofy | ................... | F04D 25/0666 |
| | | | | 417/410.1 |
| 2016/0037683 A1* | 2/2016 | Tamaoka | ............. | H10W 40/43 |
| | | | | 165/104.21 |
| 2018/0100708 A1* | 4/2018 | Hsieh | ................. | F28D 15/0275 |
| 2021/0015007 A1* | 1/2021 | Watanabe | ............. | G06F 1/203 |
| 2021/0151875 A1* | 5/2021 | Samardzija | ............. | H01Q 1/48 |
| 2023/0200014 A1* | 6/2023 | Wang | ................ | H05K 7/20336 |
| | | | | 361/700 |
| 2023/0320048 A1* | 10/2023 | Jang | .................. | H05K 7/20172 |
| | | | | 361/816 |
| 2024/0107701 A1* | 3/2024 | Abdouch | .......... | H05K 7/20172 |
| 2024/0426317 A1* | 12/2024 | He | ...................... | F04D 29/4226 |
| 2025/0240912 A1* | 7/2025 | Aiello | ............... | H05K 7/20172 |

* cited by examiner

100

FAN ASSEMBLY

FIELD

The present disclosure relates to the field of thermal heat conduction in electrical systems. More particularly, to fan assemblies for providing cooling to electrical systems.

BACKGROUND

Electronic devices used for various applications typically include one or more electrical components therein such as, for example, circuit boards, processors, memories, power supplies, batteries, and other electrical components, that generate heat during device operation. Excessive heat buildup in the device can cause premature wear and/or damage to the device or its one or more components therein. Generally, these devices include cooling assemblies that utilize conduction or convection to limit heat buildup in the device and to mitigate potential damage from excessive heat buildup.

SUMMARY

In some embodiments, a fan assembly includes: a housing, the housing defines a fan chamber; a base member including a first metallic layer located on a first side of the base member, a second metallic layer located on a second side of the base member, a channel extending through the base member, the channel places the first side in fluid communication with the second side, and the second metallic layer is joined to the first metallic layer; and a fan, the fan is coupled to the base member adjacent the second side at the channel.

In some embodiments, the fan includes: a fan motor, and a rotating fan blade, the rotating fan blade is coupled to the fan motor opposite the base member, and the fan motor is coupled to the base member at the channel using one or more fasteners.

In some embodiments, the first metallic layer extends through an aperture of the second metallic layer from the first side and out towards a distal end of the channel at the second side.

In some embodiments, the first metallic layer includes a first metallic material having a first thermal conductivity configured to limit heat buildup in the base member and improve a lifespan of the fan due to heat degradation, the second metallic layer includes a second metallic material having a second thermal conductivity configured to thermally conduct heat from a heat spreader, and the second thermal conductivity is higher than the first thermal conductivity.

In some embodiments, the first metallic layer includes stainless steel, and the first metallic layer is configured to provide structural support to the base member and the fan mounted to the base member at the channel.

In some embodiments, the second metallic layer includes: copper, and the fan is configured to circulate cooling air across a surface of the second metallic layer to dissipate heat buildup in the second metallic layer thermally conducted from the heat spreader to the second metallic layer.

In some embodiments, the first metallic layer is welded to the second metallic layer.

In some embodiments, the first metallic layer is laser welded to the second metallic layer.

In some embodiments, the base member further includes an adhesive, and the adhesive is configured to fixedly attach the first metallic layer to the second metallic layer.

In some embodiments, the adhesive includes a thermally conductive adhesive.

In some embodiments, a system for conducting thermal heat from a heat spreader, the system including a base member including: a first layer located on a first side of the base member, a second layer located on a second side of the base member, the second layer is fixedly attached to the first layer, and a channel extending from the first side to the second side, the channel is configured to be attached to a fan using one or more fasteners, and the second layer of the base member is configured to thermally conduct heat from the heat spreader.

In some embodiments, the first layer includes a stainless-steel material. In some embodiments, the first layer includes a first thermal conductivity configured to limit heat buildup in the first layer to improve a lifespan of the fan due to heat degradation.

In some embodiments, the second layer includes a copper material. In some embodiments, the second layer includes a second thermal conductivity configured to thermally conduct heat from the heat spreader. In some embodiments, the second thermal conductivity is higher than the first thermal conductivity of the first layer to enable thermally conducting heat from the heat spreader.

In some embodiments, the first layer includes a metallic material configured to provide structural support to the base member and the fan mounted to the base member at the channel.

In some embodiments, the system further including a housing assembly, the housing assembly defines a fan chamber, and the base member is located in the fan chamber.

In some embodiments, the system, further including the fan including a fan motor, the fan motor is rotatably coupled to the base member adjacent the second side at the channel, and a fan blade, the fan blade is configured to circulate cooling air across a surface of the second layer to dissipate the heat in the second layer built up from the heat spreader.

In some embodiments, the first layer extends through an aperture of the second layer and towards a distal end of the channel at the second side.

In some embodiments, the first layer is laser welded to the second layer.

In some embodiments, the base member further includes: an adhesive, wherein the adhesive is configured to fixedly attach the first layer to the second layer.

In some embodiments, the adhesive includes a thermally conductive adhesive.

BRIEF DESCRIPTION OF THE DRAWINGS

Some embodiments of the disclosure are herein described, by way of example only, with reference to the accompanying drawings. With specific reference now to the drawings in detail, it is stressed that the embodiments shown are by way of example and for purposes of illustrative discussion of embodiments of the disclosure. In this regard, the description taken with the drawings makes apparent to those skilled in the art how embodiments of the disclosure may be practiced.

DETAILED DESCRIPTION

Figure 1:
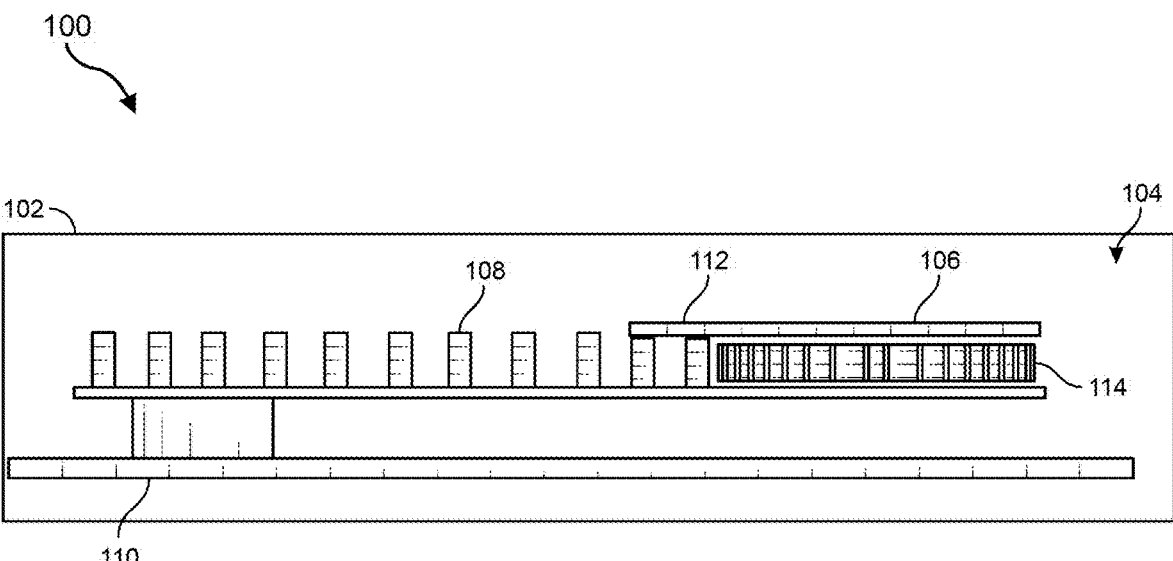
FIG. 1 is a side view of a system, according to some embodiments.

Electronic devices are used in various commercial and residential applications including, but not limited to, routers, modems, gateways, servers, wireless signal extenders, cameras, network devices, and other types of electronic devices, and typically include one or more electronic components therein that generate heat that can build up in the device interior during device operation. The temperature within the device exceeding certain limit(s) can have negative effects on the efficiency, performance, and lifespan of the device, and such temperatures can cause damage to the device or its one or more components. Accordingly, these devices can include cooling systems that provide thermal cooling using, for example, thermal conduction or thermal convection to limit or reduce heat buildup in the device.

Various embodiments of the present disclosure relate to systems, devices, and assemblies for a fan assembly for an electronic device. The fan assembly may be configured to thermal heat transfer from the heat generating components in the electronic device. In some embodiments, the fan assembly may also be configured to circulate cooling air for thermal convection, as will be further described herein.

The fan assembly can include a base member, the base member may include a first layer and a second layer. The first layer may be located on a first side of the base member and the second layer may be located on a second side of the base member opposite the first side. The first layer and second layer may be distinct substrate layers joined together so that the first layer may be attached to and adjoin the second layer. That is, in some embodiments, the first layer may be attached to the second layer so that a substantial portion of the first layer abuts a substantial portion of the second layer. The base member may also be referred to herein as a base plate, fan base plate, or other like terms.

The first layer and the second layer may be joined together using one or more methods so that first layer substantially abuts the second layer. In some embodiments, the first layer may be welded to the second layer. In other embodiments, the first layer may be laser welded to the second layer. In some embodiments, the base member may include an adhesive. The adhesive may be configured to fixedly attach the first metallic layer to the second metallic layer. In some embodiments, the adhesive may be a thermally conductive adhesive configured to be applied to an adjoining surface of one of the first layer or the second layer.

The base member may include a channel. The channel may extend through the base member and may place the first side of the base member in fluid communication with the second side of the base member. That is, the interior of the channel may define an aperture that extends through the first layer and the second layer of the base member and places the first side in fluid communication with the second side of the base member. In some embodiments, the first layer may extend from the first side through an aperture formed in the second layer and out towards a distal end of the channel at the second side.

According to some embodiments, the first layer may be a first metallic layer. The first layer may be configured to provide structural support to the base member and to enable a cooling fan to be mounted to the base member at the channel. That is, the first layer may be selected from a metallic material for its thermal characteristics and the metallic material may be selected so that the first layer and the base member may be designed with certain strength and rigidity characteristics to provide adequate structural support to the base member and to enable the fan to be mounted to the base member at the channel.

In addition, the first layer may include a first thermal conductivity, according to some embodiments. The first thermal conductivity may be configured to limit heat buildup in the base member and may limit an amount of heat that may be transferred to the fan bearing from the base member, thereby improving a lifespan of the fan and the fan's components by mitigating increased bearing temperature that may downgrade the bearing and fan life as a result of heat degradation.

According to some embodiments, the first layer may include a stainless-steel alloy. In other embodiments, the first layer may be formed substantially of the stainless-steel alloy. In yet other embodiments, the first layer may consist essentially of stainless steel. In other embodiments, the first layer may consist of stainless steel. The stainless-steel alloy of the first layer may include one or more metallic materials including, but not limited to, chromium, nickel, titanium, molybdenum, aluminum, copper, selenium, nitrogen, phosphorus, fillers, other like materials, or any combinations thereof, so that the first layer may provide the certain amount of structural support to the base member and so that the first layer may include the first thermal conductivity.

According to some embodiments, the second layer may be a second metallic layer. The second layer may be configured to thermally conduct heat from a heat spreader of the device adjacent the second layer. In some embodiments, the heat spreader (e.g., heat sink) may be in contact with the base member at the second layer. In other embodiments, the heat spreader may be in contact with the second layer of the base member at the second side. In yet other embodiments, the heat spreader may include a plurality of fins, and one or more of the fins may be in contact with the second layer of the base member at the second side. For example, the base member may include dimensions so that the base member extends beyond a perimeter of the fan and the one or more fins of the heat spreader may be in contact with the base member at the second layer adjacent the fan. In some embodiments, the heat spreader may be in contact with the base member at the first side. That is, in some embodiments, the heat spreader may be in contact with the base member at a portion of the first side and a portion of the second side. In other embodiments, the heat spreader may be in contact with the base member at the first side rather than the second side.

According to some embodiments, the second layer may include copper. In other embodiments, the second layer may be formed substantially of copper. In yet other embodiments, the second layer may consist essentially of copper. In other embodiments, the second layer may consist of copper. In some embodiments, the second layer may be formed substantially of copper and may include one or more other metallic materials including, for example, aluminum.

In addition, the first thermal conductivity of the first layer may be different from the second thermal conductivity of the second layer to enable the base member to provide different thermal heat transfer capabilities to each of the first layer and the second layer of the base member. In some embodiments, the second thermal conductivity may be higher than the first thermal conductivity. That is, the second layer may have a higher thermal conductivity than compared with the first layer because the second layer may be in thermal contact with the heat spreader in the device and the second layer may be configured to thermally conduct heat away from the heat spreader to the second layer. In addition, the first layer may have a lower thermal conductivity than compared with the second layer because the first layer may be configured to limit thermal heat transfer from the second layer to the first layer and to limit the heat buildup in the first layer to reduce thermal heat conduction to the fan to improve a lifespan of the fan due to heat degradation. In other embodiments, the second thermal conductivity may be greater than the first thermal conductivity.

The fan assembly may include a fan. The fan may be coupled to the base member adjacent the second side and the second layer at the channel. The fan may include a fan motor and a rotating fan blade. The fan motor may be coupled to the base member at the channel using one or more fasteners. In this regard, in some embodiments, the fan motor may include a protruding portion configured to be positioned in the channel to couple the fan motor to the channel of the base member using the fasteners. For example, to couple the fan motor to the base member, the protruding portion may be inserted into the channel, the protruding portion including a threaded bore configured to be colinearly aligned with an aperture extending through a sidewall of the channel to receive a fastener to attach the fan motor to the base member. The fasteners may include, but is not limited to, screws, bolts, nuts, rivets, clamps, epoxies, adhesives, clips, fittings, couplers, solder, other types of fasteners, or any combinations thereof. For example, the fan motor may be coupled to the base member as the channel using a plurality of rivets.

The fan blade may be rotatably coupled to the fan motor so that the operation of the fan motor causes the fan blade to rotate and provide thermal cooling to the base member and/or to the other components in the device. In some embodiments, the fan may be configured to circulate cooling air across a surface of the second layer to dissipate the heat built up in the second layer that may be thermally conducted from the heat spreader to the second layer. In some embodiments, the fan blade may be coupled to the fan motor opposite the base member. That is, the fan motor may be located in between the base member and the fan blade. In other embodiments, the fan blade may be arranged around at least a portion of the fan motor so that the fan blade may be located adjacent the second layer of the base member. That is, the fan blade may include a channel located at a central axis of the fan blade and the fan motor may include dimensions so that the fan motor may be arranged in the channel. In this regard, the fan motor may be rotatably coupled to the fan blade adjacent one end of the fan motor and coupled to the base member adjacent the opposite end of the fan motor.

According to some embodiments, a system for an electronic device may include a housing. The system may include one or more members that may be attached to each other to form the housing. The housing may include one or more interior regions. In some embodiments, the interior regions of the housing may include a fan chamber. In other embodiments, the interior regions of the housing may include a region for housing electronic components of the system such as, for example, an electronics printed circuit board including a processor for controlling the one or more electrical components including the fan assembly.

The fan assembly, or one or more components thereof, may be arranged in the fan chamber. In some embodiments, the base member may be arranged in the fan chamber. In other embodiments, the base member and the fan may be arranged in the fan chamber. In yet other embodiments, the base member, the fan, and the heat spreader may be arranged in the fan chamber. It is to be appreciated by those having ordinary skill in the art that the embodiments shown in the figures are exemplary and not intended to be limiting. In this regard, it is also to be appreciated by those having ordinary skill in the art that the system and the one or more components therein, including the fan assembly, may include any of a plurality of different sizes, shapes, and dimensions, so long as the fan assembly may provide thermally conductive heat transfer from the heat spreader, or from any of a plurality of other heat generating components, and the fan may circulate cooling air to dissipate heat buildup in the base member and/or the rest of the device.

The various embodiments of the present disclosure provide improvements over other fan assemblies for electrical devices by utilizing a two-layer base member including a first metallic layer and a second metallic layer. The first metallic layer is made of a first metallic material and includes a first thermal conductivity. The second metallic material is configured to include a second thermal conductivity so that the second thermal conductivity is greater than the first thermal conductivity. That is, the first metallic layer is configured to provide structural support for mounting the fan and for enabling stable fan operation. The first metallic layer also limits thermal heat transfer to the fan from the second metallic layer. The second metallic layer is configured to have a higher thermal conductivity relative the first metallic layer to provide improved thermal heat transfer away from the one or more heat generating components.

Other fan assemblies can use non-metallic materials in the fan base member which provides inferior structural support to the fan, and which do not enable the base member to serve as a heat sink to provide thermal cooling capabilities as compared to the embodiments in the present disclosure. In addition, other fan members may utilize a base member, to which the fan may be mounted, that is made of a single metallic material such as, for example, stainless-steel due to the strength considerations but does not include a second layer made of a different metallic material having a higher thermal conductivity than the first layer for drawing heat away from the heat spreader and where the second layer is arranged so that the fan can directly circulate cooling air onto a surface of the second layer to dissipate the heat built up in the second layer as compared to embodiments in the present disclosure. In one non-limiting example, an example embodiment of the fan assembly 106 can reduce a temperature at a chipset, heat spreader, and fan base by more than 4° C. as compared to a fan base member including only one layer.

Among those benefits and improvements that have been disclosed, other objects and advantages of this disclosure will become apparent from the following description taken in conjunction with the accompanying figures. Detailed embodiments of the present disclosure are disclosed herein; however, it is to be understood that the disclosed embodiments are merely illustrative of the disclosure that may be embodied in various forms. In addition, each of the examples given regarding the various embodiments of the disclosure which are intended to be illustrative, and not restrictive.

Figure 2:
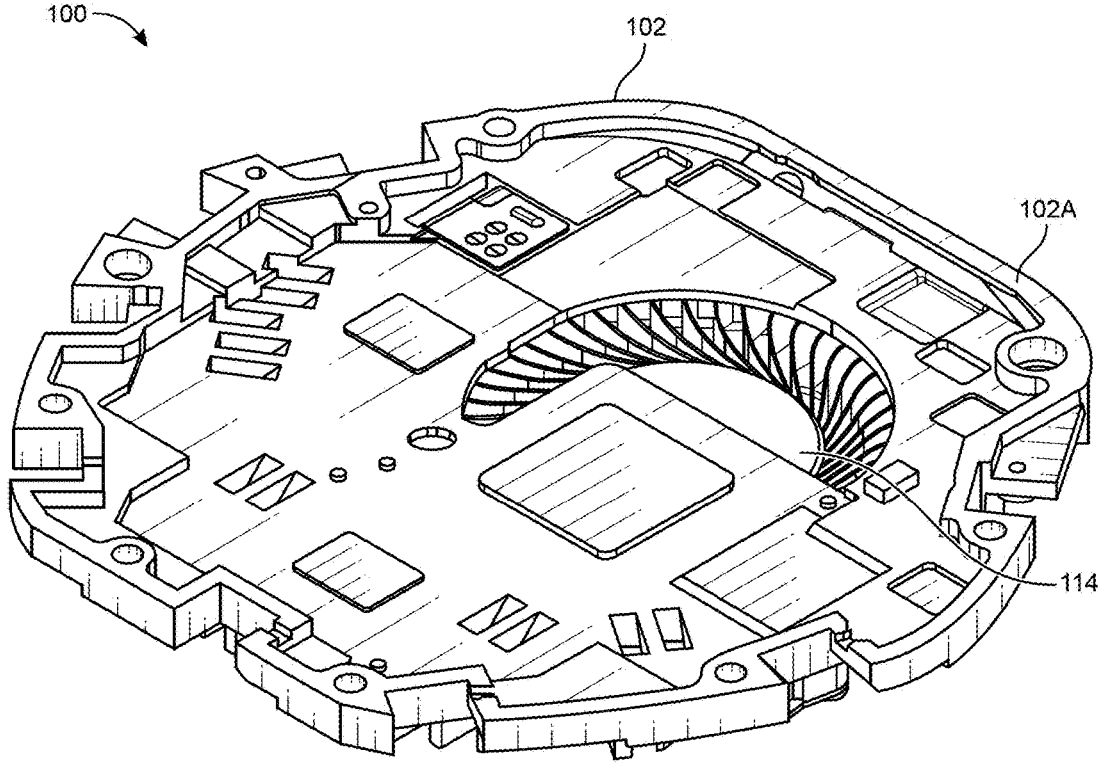
FIG. 2 is a first perspective view of the system, according to some embodiments.

FIG. 1 is a side view of a system 100, according to some embodiments. FIG. 2 is a first perspective view of the system 100 of FIG. 1, according to some embodiments. Unless specifically referenced, FIGS. 1 and 2 will be described collectively.

System 100 includes housing 102. Housing 102 may include one or more housing members configured to define an exterior of the device of system 100. Housing 102 may also define one or more interior regions therein. The interior regions of the housing 102 may include a fan chamber 104 defined by one or more sidewalls of the housing 102, as shown in FIG. 2.

System 100 may include a fan assembly 106, a heat spreader 108, and one or more electrical components 110. During operation, the electronic components in system 100 may generate heat that accumulates in the interior region of housing 102. The heat spreader 108 may be in thermal connection with one or more of the electrical components 110 and may thermally transfer heat away from the electrical components 110 to the heat spreader 108, e.g., provide cooling to the electrical components 110. The heat spreader 108 may include a plurality of cooling fins. In addition, one or more of the cooling fins of heat spreader 108 may be in thermal contact with the base member 112 so that the base member 112 may thermally conduct heat away from the heat spreader 108, as will be further described herein.

The electronic components 110 may include, for example, a processor, a memory, a power supply, and one or more other electrical components arranged on one or more printed circuit boards ("PCBs"), for performing any of a variety of different practical applications. For example, system 100 may be an electronic device including, but not limited to, a computing device, modem, router, gateway, signal extender, server, measuring device, camera, and other like devices, that may be used in various commercial or residential applications. It is to be appreciated that the specific application of the electronic device of system 100 is exemplary and is not intended to be limiting.

Referring to FIG. 2, the fan assembly 106 may be arranged in the fan chamber 104 of the housing 102. Although not shown in the figures, the housing 102 may include a plurality of other interior regions or chambers. For example, in some embodiments, one or more of the electrical components of system 100 may be located in a chamber located below the bottom surface of housing 102a as shown in FIG. 2.

The fan assembly 106 may include an electrical cable 128. The electrical cable 128 may extend between the fan 114 to the electrical components 110 and place the fan 114 in electronic communication with a fan controller. In some embodiments, the electrical components 110 may include the fan controller. In some embodiments, the electrical cable 128 may be a ribbon cable configured to extend from the electrical components 110 and between the base member 112 and the fan blade 132 to connect to the fan motor 130 (FIG. 3).

The fan assembly 106 may be first assembled and then installed into the housing 102 of system 100. In this regard, in some embodiments, the base member 112 may include one or more slots, apertures, bores, or the like, extending through the base member 112 and arranged on the base member 112 to enable the fan assembly 106 to be installed into the housing 102 using, for example, one or more fasteners. The fasteners may include, but is not limited to, screws, bolts, nuts, standoffs, rivets, clamps, clips, connectors, retaining elements, other like fasteners, or any combinations thereof.

Figure 3:
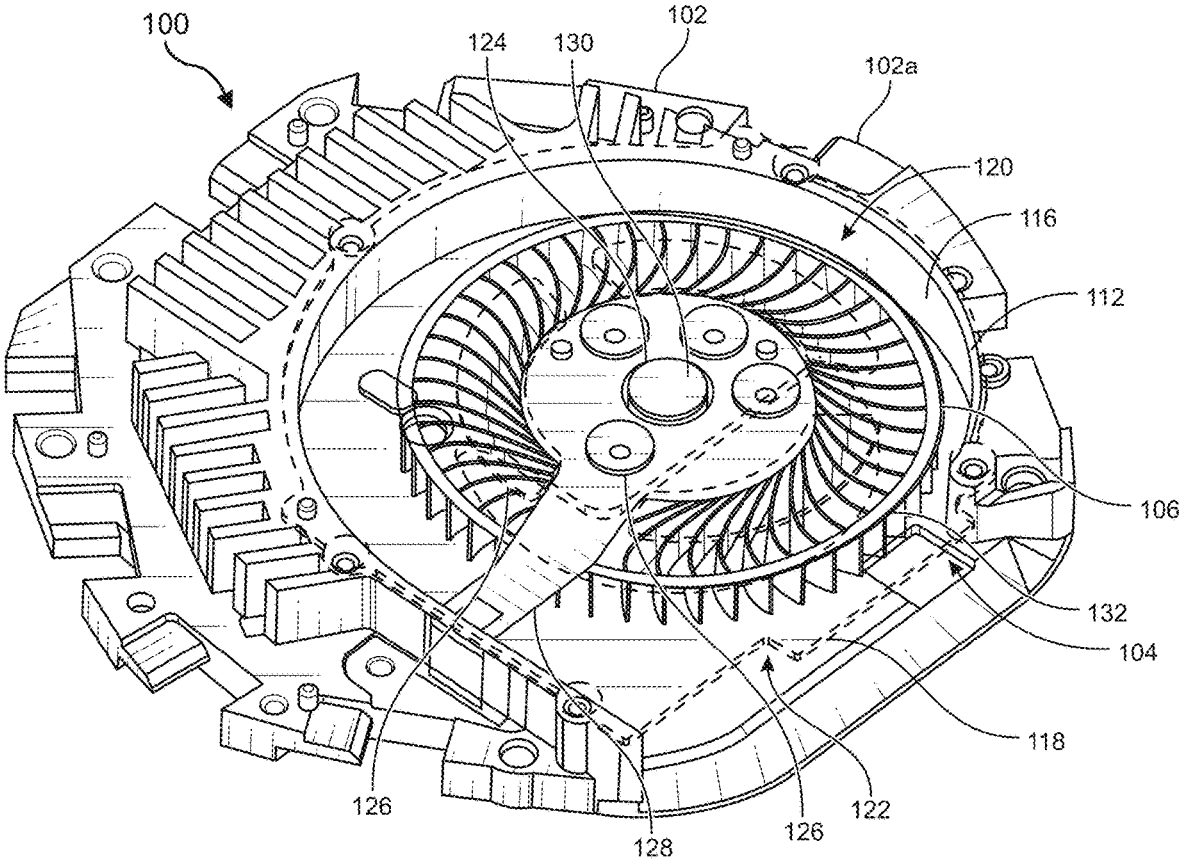
FIG. 3 is an exposed second perspective view of the system, according to some embodiments.

FIG. 3 is an exposed second perspective view of the system 100, according to some embodiments.

The fan assembly 106 includes a base member 112 and a fan 114. The base member 112 includes a first metallic layer 116 and a second metallic layer 118. The first metallic layer 116 is located on a first side 120 of base member 112. The second metallic layer 118 is located on a second side 122 of base member 112. The first metallic layer 116 is joined to the second metallic layer 118.

The base member 112 also includes a channel 124. The channel 124 extends through the base member 112. In some embodiments, the channel 124 may be centrally arranged on the base member 112. The channel 124 is configured to place the first side 120 of base member 112 in fluid communication with the second side 122 of base member 112. In some embodiments, the base member 112 may include other apertures 126 extending through the base member 112. The size and shape of the other apertures 126 may depend on the size and shape of the base member 112, fan 114, other components of system 100, or any combinations thereof. The other apertures 126 may be configured to enable cooling air provided by the fan 114 to be circulated through the base member 112 and around the interior regions of the housing 102.

The fan 114 is coupled to the base member 112 at the channel 124 adjacent the second side 122. That is, the fan 114 is coupled to the base member 112 opposite the first side 120. The fan 114 includes a fan motor 130 and a fan blade 132. In some embodiments, the fan motor 130 is coupled to the base member 112 at the channel 124 using one or more fasteners, not shown. The fasteners may include, but is not limited to, screws, bolts, nuts, rivets, clamps, epoxies, adhesives, clips, fittings, couplers, solder, other types of fasteners, or any combinations thereof. For example, the fan motor 130 may be coupled to the base member 112 at the channel 124 using a plurality of rivets. In another example, the fan motor 130 may be coupled to the base member 112 at the channel 124 using threaded screws configured to extend through an aperture at the channel 124 and engage a threaded bore of the fan motor 130.

Figure 4:
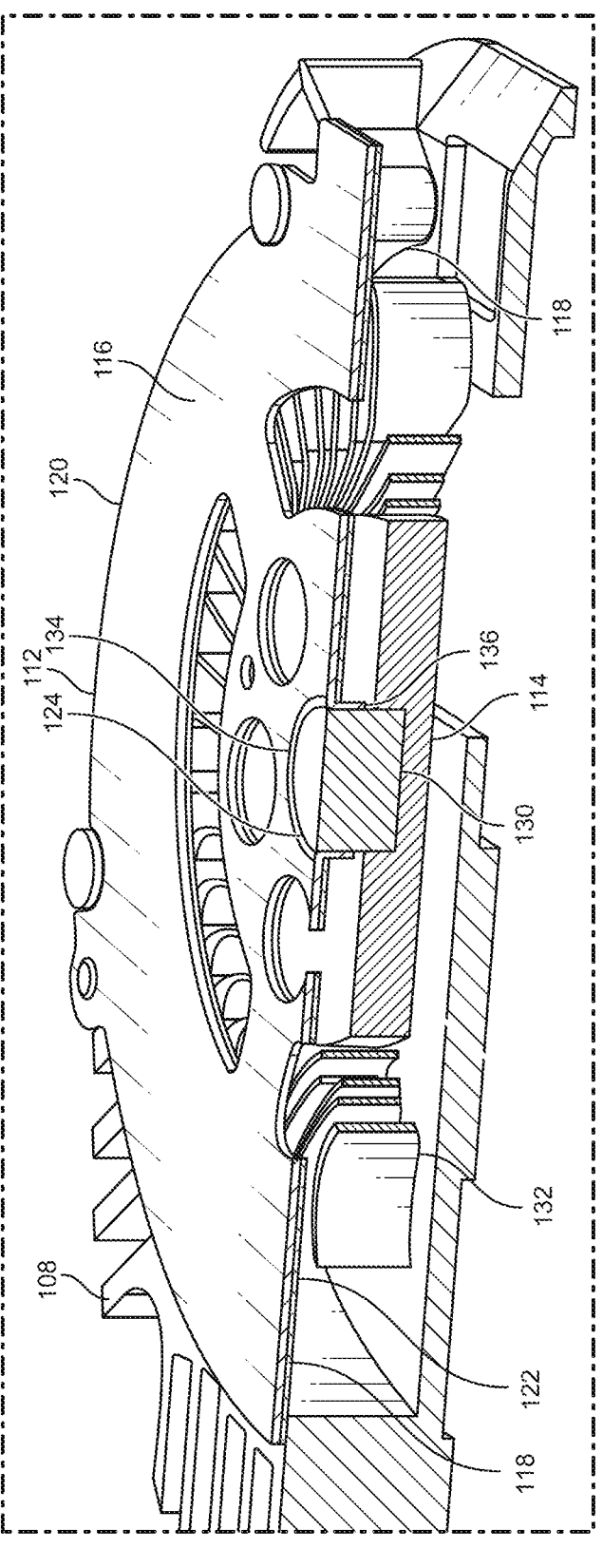
FIG. 4 is a sectional perspective view of the system, according to some embodiments.
Figure 5:
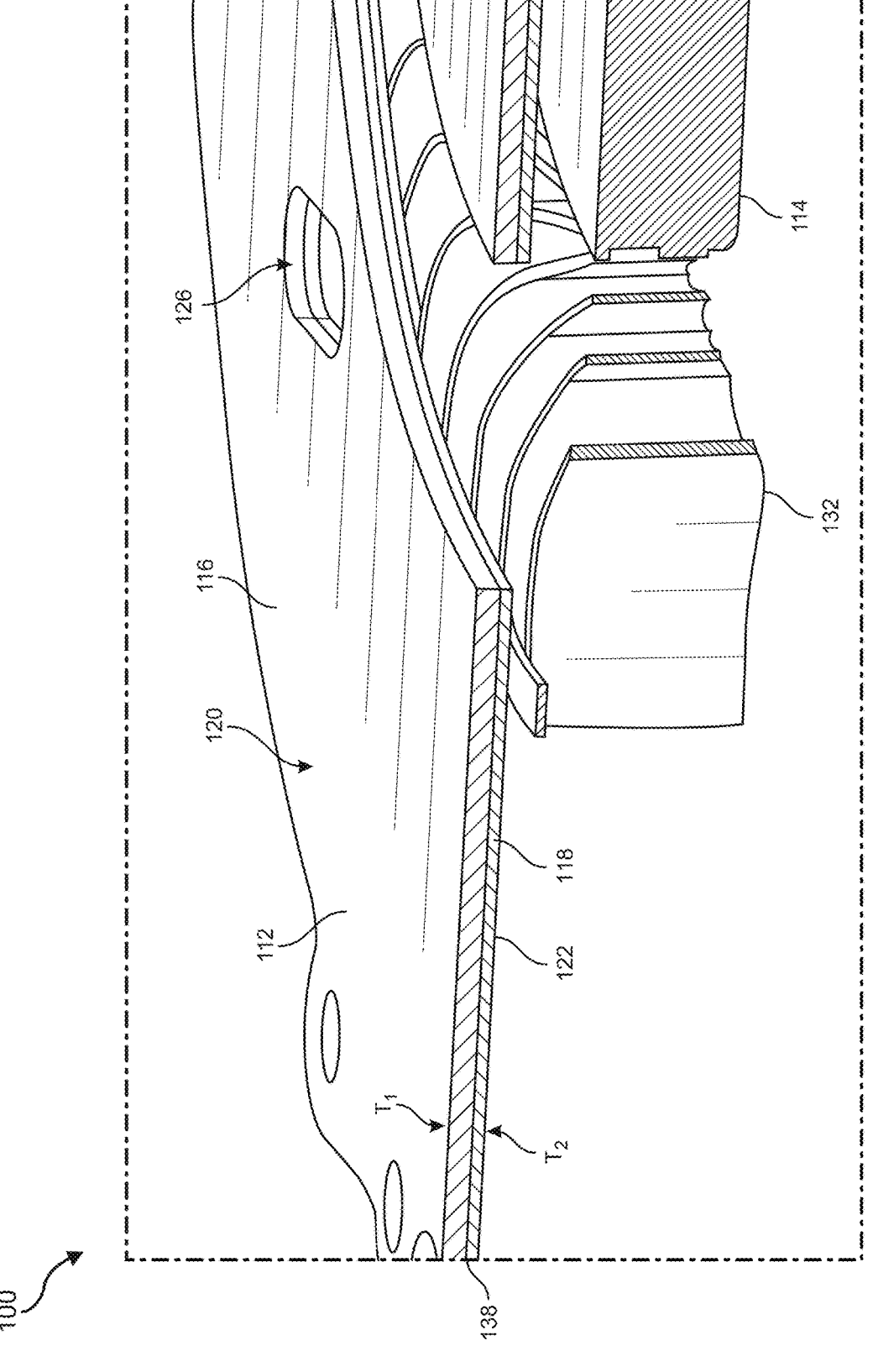
FIG. 5 is a sectional perspective view of a portion of the system, according to some embodiments.
Figure 6:
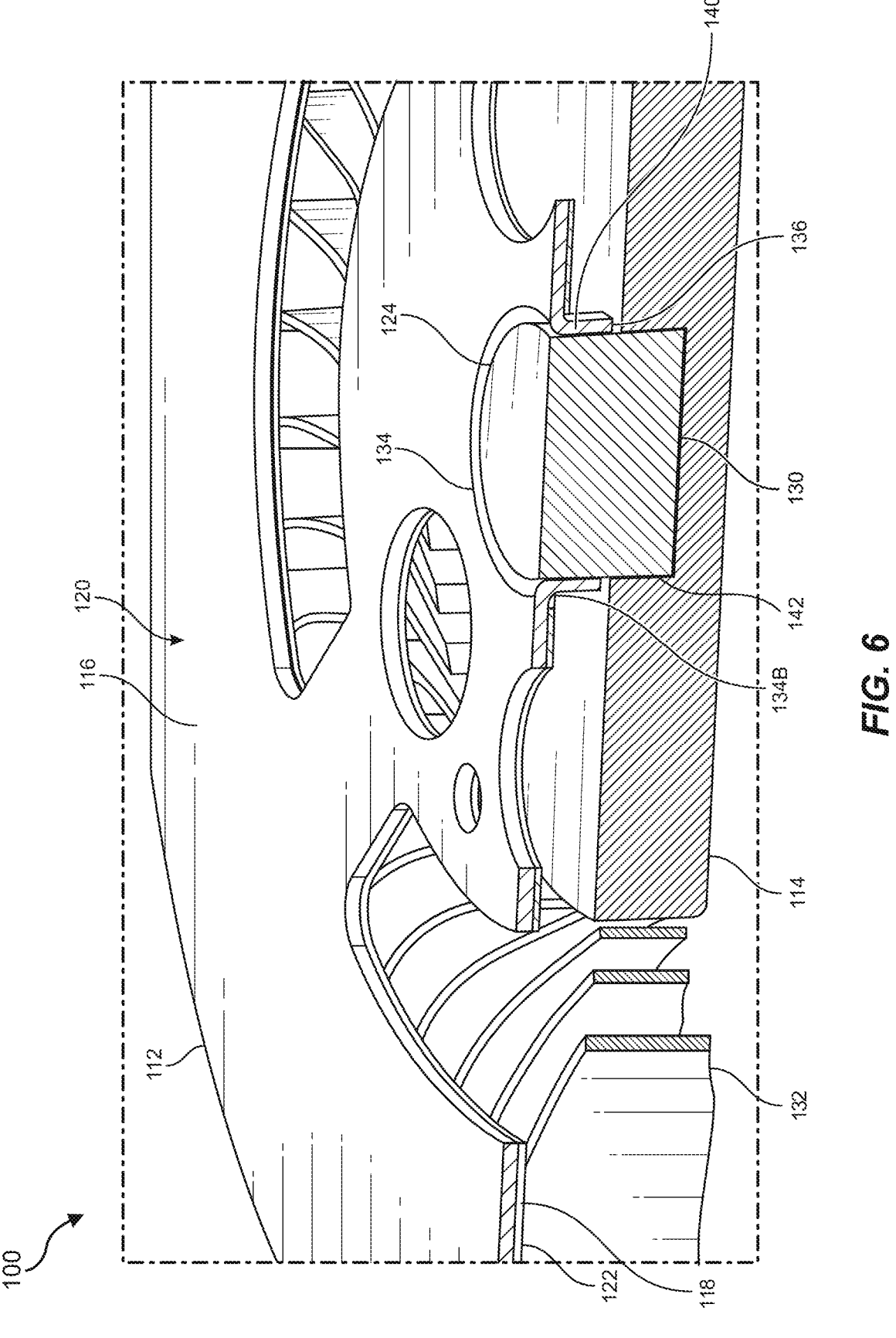
FIG. 6 is a sectional perspective view of another portion of the system, according to some embodiments.

FIG. 4 is a sectional perspective view of the system 100, according to some embodiments. FIG. 5 is a sectional perspective view of a portion of the system 100, according to some embodiments. FIG. 6 is a sectional perspective view of another portion of the system 100, according to some embodiments. Unless specifically referenced, FIGS. 4-6 will be described collectively.

The base member 112 may include an aperture 134 extending therethrough. In some embodiments, the first metallic layer 116 may include an aperture 134a and second metallic layer 118 may include an aperture 134b. The first metallic layer 116 extends through aperture 134b of the second metallic layer 118 from the first side 120 and out towards a distal end 136 of the channel 124 at the second side 122. The distal end 136 of the channel 124 may form the aperture 134a. In this regard, the first metallic layer 116 extends from the first side 120 and to the second side 122, and the fan 114 is configured to be coupled to the first metallic layer 116 of base member 112 at channel 124.

The first metallic layer 116 is configured to provide structural support to the base member 112 and the fan 114 mounted to the base member 112 at the channel 124. The first metallic layer 116 provides the structural support to the base member 112 to enable the base member 112 to serve as a foundation for the fan 114 and to ensure the stable and balanced rotation of the fan blade 132 by the fan motor 130. In addition, by the first metallic layer 116 made of the first metallic material forming the channel 124, the first metallic layer 116 provides a member having sufficient structural strength where the fan 114 can be attached to the base member 112 without compromising the stability of the operation of the fan 114. In this regard, the first metallic layer 116 includes a first thickness, $t_1$.

The first metallic layer 116 may include a first thickness of 0.1 mm to 1 cm, or any range or subrange therebetween. In some embodiments, the first metallic layer 116 may include a first thickness of 0.1 mm to 1 cm, 0.2 mm to 1 cm, 0.3 mm to 1 cm, 0.4 mm to 1 cm, 0.5 mm to 1 cm, 0.6 mm to 1 cm, 0.7 mm to 1 cm, 0.8 mm to 1 cm, 0.9 mm to 1 cm, 0.1 mm to 0.9 mm, 0.2 mm to 0.9 mm, 0.3 mm to 0.9 mm, 0.4 mm to 0.9 mm, 0.5 mm to 0.9 mm, 0.6 mm to 0.9 mm, 0.7 mm to 0.9 mm, 0.8 mm to 0.9 mm, 0.1 mm to 0.8 mm, 0.2 mm to 0.8 mm, 0.3 mm to 0.8 mm, 0.4 mm to 0.8 mm, 0.5 mm to 0.8 mm, 0.6 mm to 0.8 mm, 0.7 mm to 0.8 mm, 0.1 mm to 0.7 mm, 0.2 mm to 0.7 mm, 0.3 mm to 0.7 mm, 0.4 mm to 0.7 mm, 0.5 mm to 0.7 mm, 0.6 mm to 0.7 mm, 0.1 mm to 0.6 mm, 0.2 mm to 0.6 mm, 0.3 mm to 0.6 mm, 0.4 mm to 0.6 mm, 0.5 mm to 0.6 mm, 0.1 mm to 0.5 mm, 0.2 mm to 0.5 mm, 0.3 mm to 0.5 mm, 0.4 mm to 0.5 mm, or other thickness ranges. In one example, the first metallic layer 116 may include a first thickness of 0.3 mm. In another example, the first metallic layer 116 may include a first thickness of 0.4 mm. In yet another example, the first metallic layer 116 may include a first thickness of 0.8 mm.

The first metallic layer 116 may be formed including a first metallic material having a first thermal conductivity. The first metallic material of the first metallic layer 116 is configured to limit heat buildup in the base member 112 to improve a lifespan of the fan 114 by mitigating negative effects that heat degradation can have on the efficiency, performance, and/or lifespan of the fan 114. That is, the first metallic material may include a first thermal conductivity configured to limit heat buildup in the first metallic layer 116 and to limit an amount of heat that may transfer to the fan 114 bearing as increased bearing temperature can downgrade the life of the bearing or bearings in the fan 114 and the overall life of the fan 114. In some embodiments, the first metallic layer 116 may include stainless-steel. In other embodiments, the first metallic layer 116 may be made of stainless steel.

The first thermal conductivity may be between 1 W/m-k to 150 W/m-k, or any range or subrange therebetween. In some embodiments, the first thermal conductivity may be between 1 W/m-k to 150 W/m-k, 1 W/m-k to 125 W/m-k, 1 W/m-k to 100 W/m-k, 1 W/m-k to 75 W/m-k, 1 W/m-k to 50 W/m-k, 1 W/m-k to 40 W/m-k, 1 W/m-k to 30 W/m-k, 1 W/m-k to 20 W/m-k, 1 W/m-k to 10 W/m-k, 10 W/m-k to 150 W/m-k, 10 W/m-k to 125 W/m-k, 10 W/m-k to 100 W/m-k, 10 W/m-k to 75 W/m-k, 10 W/m-k to 50 W/m-k, 10 W/m-k to 40 W/m-k, 10 W/m-k to 30 W/m-k, 10 W/m-k to 20 W/m-k, 20 W/m-k to 150 W/m-k, 20 W/m-k to 125 W/m-k, 20 W/m-k to 100 W/m-k, 20 W/m-k to 75 W/m-k, 20 W/m-k to 50 W/m-k, 20 W/m-k to 40 W/m-k, 20 W/m-k to 30 W/m-k, 30 W/m-k to 150 W/m-k, 30 W/m-k to 125 W/m-k, 30 W/m-k to 100 W/m-k, 30 W/m-k to 75 W/m-k, 30 W/m-k to 50 W/m-k, 30 W/m-k to 40 W/m-k, or other thermal conductivity ranges. In one non-limiting example, the first metallic layer 116 may include a first thermal conductivity from 1 W/m-k to 20 W/m-k. In another example, the first metallic layer 116 may include a first thermal conductivity from 10 W/m-k to 20 W/m-k. In yet another example, the first metallic layer 116 may be made substantially of a stainless-steel alloy and have a thermal conductivity of approximately 15 W/m-k.

The second metallic layer 118 may be formed including a second metallic material having a second thermal conductivity. The second metallic layer 118 may be configured to thermally conduct heat from the heat spreader 108. In some embodiments, the second thermal conductivity of the second metallic layer 118 is higher than the first thermal conductivity of the first metallic layer 116. In some embodiments, the second metallic layer 118 may include copper. In other embodiments, the second metallic layer 118 may be made of copper. In this regard, the second metallic layer 118 includes a second thickness, $t_2$.

The second metallic layer 118 may include a second thickness of 0.1 mm to 1 cm, or any range or subrange therebetween. In some embodiments, the second metallic layer 118 may include a second thickness of 0.1 mm to 1 cm, 0.2 mm to 1 cm, 0.3 mm to 1 cm, 0.4 mm to 1 cm, 0.5 mm to 1 cm, 0.6 mm to 1 cm, 0.7 mm to 1 cm, 0.8 mm to 1 cm, 0.9 mm to 1 cm, 0.1 mm to 0.9 mm, 0.2 mm to 0.9 mm, 0.3 mm to 0.9 mm, 0.4 mm to 0.9 mm, 0.5 mm to 0.9 mm, 0.6 mm to 0.9 mm, 0.7 mm to 0.9 mm, 0.8 mm to 0.9 mm, 0.1 mm to 0.8 mm, 0.2 mm to 0.8 mm, 0.3 mm to 0.8 mm, 0.4 mm to 0.8 mm, 0.5 mm to 0.8 mm, 0.6 mm to 0.8 mm, 0.7 mm to 0.8 mm, 0.1 mm to 0.7 mm, 0.2 mm to 0.7 mm, 0.3 mm to 0.7 mm, 0.4 mm to 0.7 mm, 0.5 mm to 0.7 mm, 0.6 mm to 0.7 mm, 0.1 mm to 0.6 mm, 0.2 mm to 0.6 mm, 0.3 mm to 0.6 mm, 0.4 mm to 0.6 mm, 0.5 mm to 0.6 mm, 0.1 mm to 0.5 mm, 0.2 mm to 0.5 mm, 0.3 mm to 0.5 mm, 0.4 mm to 0.5 mm, or other thickness ranges. In one example, the second metallic layer 118 may include a second thickness of 0.2 mm. In another example, the first metallic layer 116 may include a second thickness of 0.4 mm. In yet another example, the first metallic layer 116 may include a second thickness of 0.7 mm.

The second thermal conductivity may be between 150 W/m-k to 800 W/m-k, or any range or subrange therebetween. In some embodiments, the second thermal conductivity may be between 150 W/m-k to 800 W/m-k, 150 W/m-k to 750 W/m-k, 150 W/m-k to 700 W/m-k, 150 W/m-k to 650 W/m-k, 150 W/m-k to 600 W/m-k, 150 W/m-k to 550 W/m-k, 150 W/m-k to 500 W/m-k, 150 W/m-k to 450 W/m-k, 150 W/m-k to 400 W/m-k, 150 W/m-k to 350 W/m-k, 150 W/m-k to 300 W/m-k, 200 W/m-k to 800 W/m-k, 200 W/m-k to 750 W/m-k, 200 W/m-k to 700 W/m-k, 200 W/m-k to 650 W/m-k, 200 W/m-k to 600 W/m-k, 200 W/m-k to 550 W/m-k, 200 W/m-k to 500 W/m-k, 200 W/m-k to 450 W/m-k, 200 W/m-k to 400 W/m-k, 200 W/m-k to 350 W/m-k, 200 W/m-k to 300 W/m-k, 250 W/m-k to 800 W/m-k, 250 W/m-k to 750 W/m-k, 250 W/m-k to 700 W/m-k, 250 W/m-k to 650 W/m-k, 250 W/m-k to 600 W/m-k, 250 W/m-k to 550 W/m-k, 250 W/m-k to 500 W/m-k, 250 W/m-k to 450 W/m-k, 250 W/m-k to 400 W/m-k, 250 W/m-k to 350 W/m-k, 250 W/m-k to 300 W/m-k, 300 W/m-k to 800 W/m-k, 300 W/m-k to 750 W/m-k, 300 W/m-k to 700 W/m-k, 300 W/m-k to 650 W/m-k, 300 W/m-k to 600 W/m-k, 300 W/m-k to 550 W/m-k, 300 W/m-k to 500 W/m-k, 300 W/m-k to 450 W/m-k, 300 W/m-k to 400 W/m-k, 300 W/m-k to 350 W/m-k, or other thermal conductivity ranges. In one non-limiting example, the second metallic layer 118 may include a second thermal conductivity from 250 W/m-k to 450 W/m-k. In another example, the second metallic layer 118 may include a second thermal conductivity from 300 W/m-k to 450 W/m-k. In yet another example, the second metallic layer 118 may be made substantially of copper and have a thermal conductivity of approximately 400 W/m-k. In another example, the first metallic layer 116 may be made of a first metallic material having a first thermal conductivity of 16 W/m-k and the second metallic layer 118 may be made of a second metallic material having a second thermal conductivity of 398 W/m-k.

In some embodiments, the dimensions of the base member 112 including the size, shape, and individual thicknesses of the first metallic layer 116 and second metallic layer 118 may be dependent on the overall dimensions of the system 100 and a desired thermal cooling characteristics. For example, the size and thickness of the first metallic layer 116 and second metallic layer 118 of the base member 112 may be based on the heat generated by the electrical components 110 and the desired thermal cooling characteristics in the device of system 100. In this regard, it is to be appreciated by those having ordinary skill in the art that the size, shape, dimensions, thickness, and thermal conductivity of the first metallic layer 116 and second metallic layer 118 are not intended to be limiting and may be less than or greater than the specified ranges to enable the fan assembly 106 to provide a desired thermal cooling in the system 100 in accordance with the present disclosure.

The second thermal conductivity of the second metallic layer 118 is configured to enable the thermal conduction of heat away from heat spreader 108, or away from one or more other heat generating components in system 100, to the second metallic layer 118. In addition, the first thermal conductivity of the first metallic layer 116 is configured to enable limiting thermal conduction of heat away from the second metallic layer 118 by the first metallic layer 116. In this regard, although a small amount of thermal heat transfer may occur between the first metallic layer 116 and second metallic layer 118 during operation, the first metallic layer 116 is configured to limit heat buildup in the first metallic layer 116 and to limit the transfer of heat to fan 114 or to any other components of system 100 in connection with the first metallic layer 116 to limit having a negative effect on the lifespan of the components due to high heat. In addition, to provide cooling to the second metallic layer 118 of base member 112, the fan 114 is operable to rotate the fan blade 132 and circulate cooling air across a surface of the second metallic layer 118 to dissipate the heat buildup in the second metallic layer 118 from the heat spreader 108. In some embodiments, the fan blade 132 of fan 114 may directly supply the cooling air to the surface of the second metallic layer 118 of base member 112 to dissipate the heat buildup in the second metallic layer 118 from heat spreader 108. In this regard, in some embodiments, the base member 112 and the second metallic layer 118 may be in thermal contact with the heat spreader 108 or one or more of the plurality of fins of the heat spreader 108.

Referring to FIG. 5, the base member 112 includes the first metallic layer 116 on the first side 120 of base member 112 and includes the second metallic layer 118 on the second side 122 of base member 112. The first metallic layer 116 may be joined to the second metallic layer 118. In some embodiments, the first metallic layer 116 may be joined to the second metallic layer 118 so that a substantial portion of a surface of first metallic layer 116 is in thermal contact with a substantial portion of a corresponding facing surface of the second metallic layer 118. In some embodiments, the first metallic layer 116 may be welded to the second metallic layer 118. In other embodiments, the first metallic layer 116 may be laser welded to the second metallic layer 118.

In some embodiments, the base member 112 further includes an adhesive 138. The adhesive 138 being located between the first metallic layer 116 and the second metallic layer 118. The adhesive 138 is configured to fixedly attach the first metallic layer 116 to the second metallic layer 118. In some embodiments, the adhesive 138 is a thermally conductive adhesive.

Referring to FIG. 6, the fan 114 may be coupled to base member 112. The fan 114 includes the fan motor 130 and the fan blade 132. The fan motor 130 is configured to couple to the base member 112 and the fan blade 132 is rotatably attached to the fan motor 130. In this regard, the fan motor 130 is operable to rotate the fan blade 132 to direct cooling air through the fan chamber 104.

A portion of the fan motor 130 may be arranged in the channel 124 of base member 112 and coupled to the base member 112 using one or more fasteners. In some embodiments, the fan motor 130 may include a protruding portion 140 configured to be inserted into the channel 124, the protruding portion 140 including one or more regions to enable the fan motor 130 to be mounted to the base member 112 using fasteners. For example, the protruding portion 140 may include one or more threaded bores for receiving threaded fasteners. In another example, the protruding portion 140 may be fixedly attached to the base member 112 using rivets that connect the first metallic layer 116 to the fan motor 130.

In some embodiments, the fan blade 132 may be arranged relative the fan motor 130 so that the fan blade 132 is positioned adjacent the second metallic layer 118 of base member 112 on the second side 122. In some embodiments, the fan blade 132 may be located around a periphery of the fan motor 130. In this regard, in some embodiments, the fan blade 132 may include an aperture 142 extending through a central axis of fan blade 132 and the fan motor 130, or a portion thereof, may be located in aperture 142. As such, in some embodiments, the channel 124 and the aperture 142 may be in substantially colinear alignment, and the fan motor 130 may be arranged so that one end of the fan motor 130 is located in channel 124 of base member 112 and the other end of fan motor 130 is located in the aperture 142 of fan blade 132. In some embodiments, the aperture 142 may extend entirely through the fan blade 132. In other embodiments, the aperture 142 may extend partly through fan blade 132.

Figure 7:
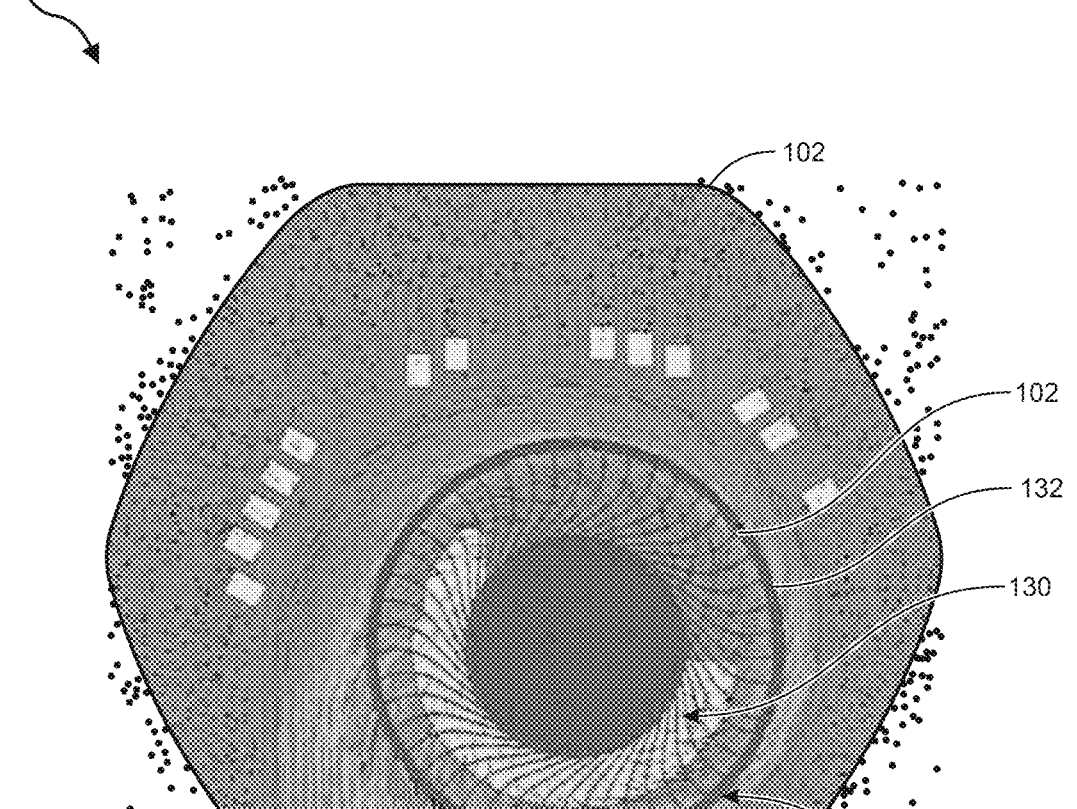
FIG. 7 is a bottom view of the system, according to some embodiments.

FIG. 7 is a bottom view of the system 100, according to some embodiments. Referring to FIG. 7, the fan assembly 106 is configured to circulate cooling air in the fan chamber 104. The fan 114 is configured to circulate cooling air across a surface of the second metallic layer 118 of the base member 112 to dissipate heat buildup in the second metallic layer 118, the heat buildup being thermally conducted from the heat spreader 108 to the second metallic layer 118. That is, the rotation of the fan blade 132 causes cooling air to be drawn into the fan chamber 104 and the cooling air is then swept or blown across the base of the fan 114 and across the surface of the second metallic layer 118 of the base member 112. In some embodiments, the cooling air may be drawn into the fan chamber 104 from outside the system 100 (e.g., air from a region external to system 100) such as through one or more air vents arranged in a side of the housing 102. In other embodiments, the cooling air may be drawn in from the outside of the system 100 and through one or more interior regions such as, for example, through an area housing the electrical components 110. By causing the cooling air to sweep across and/or blow onto the surface of the second metallic layer 118 at the base of the fan 114, the fan 114 is capable of efficiently cooling down the temperature of the second metallic layer 118 and the base member 112.

Figure 8:
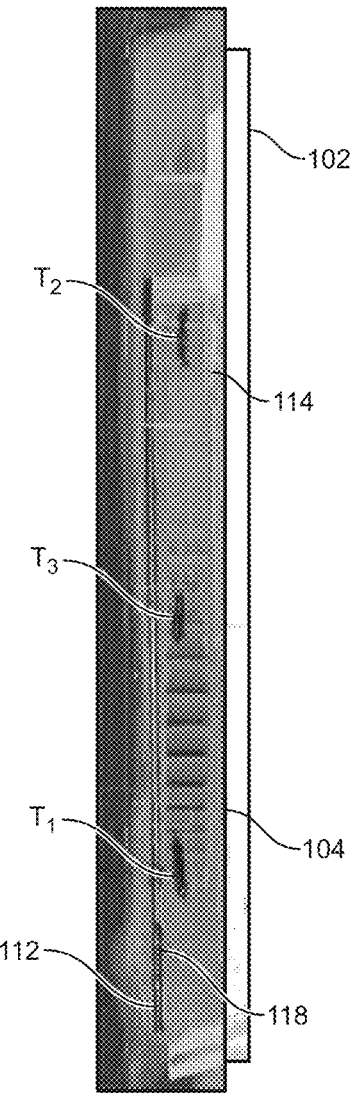
FIG. 8 is a side view of the system, according to some embodiments.

FIG. 8 is a partially exposed side view of the system 100, according to some embodiments. The fan 114 may cause the cooling air to circulate through the fan chamber 104 and may cause the cooling air to sweep across the surface of the second metallic layer 118. In some embodiments, the cooling air may enter the fan chamber 104 at a first temperature, $t_1$. In addition, as the cooling air is directed by the fan 114 across the surface of the second metallic layer 118 of base member 112, the temperature of the cooling air may be at a second temperature, $t_2$, the second temperature being a result of thermal convection of the heat built up in the second metallic layer 118 being transferred to the cooling air. Moreover, the cooling air at a central portion of the fan chamber 104 may be at a third temperature, $t_3$, the third temperature resulting from a dissipation of the heat buildup in the cooling air as a result of thermal convection. In some embodiments, the first temperature, $t_1$, may be less than the second temperature, $t_2$, and higher than the third temperature, $t_3$. In some embodiments, the second temperature, $t_2$, may be higher than the first temperature, $t_1$, and the third temperature, $t_3$. In some embodiments, the third temperature is less than the first temperature, $t_1$, and the second temperature, $t_2$.

All prior patents and publications referenced herein are incorporated by reference in their entireties.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though it may. Furthermore, the phrases "in another embodiment" and "in some other embodiments" as used herein do not necessarily refer to a different embodiment, although it may. All embodiments of the disclosure are intended to be combinable without departing from the scope or spirit of the disclosure.

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As used herein, the term "between" does not necessarily require being disposed directly next to other elements. Generally, this term means a configuration where something is sandwiched by two or more other things. At the same time, the term "between" can describe something that is directly next to two opposing things. Accordingly, in any one or more of the embodiments disclosed herein, a particular structural component being disposed between two other structural elements can be:

disposed directly between both of the two other structural elements such that the particular structural component is in direct contact with both of the two other structural elements;

disposed directly next to only one of the two other structural elements such that the particular structural component is in direct contact with only one of the two other structural elements;

disposed indirectly next to only one of the two other structural elements such that the particular structural component is not in direct contact with only one of the two other structural elements, and there is another element which juxtaposes the particular structural component and the one of the two other structural elements;

disposed indirectly between both of the two other structural elements such that the particular structural component is not in direct contact with both of the two other structural elements, and other features can be disposed therebetween; or any combination(s) thereof.

What is claimed is:

1. A fan assembly comprising: a housing, wherein the housing defines a fan chamber; a base member comprising: a first metallic layer located on a first side of the base member, a second metallic layer located on a second side of the base member, and a channel extending through the base member, wherein the channel places the first side in fluid communication with the second side, wherein the second metallic layer is joined to the first metallic layer; and a fan, wherein the fan is coupled to the base member adjacent the second side at the channel, the fan comprising; a fan motor, and a rotating blade, wherein the rotating fan blade is coupled to the fan motor opposite the base member; and wherein the fan motor is coupled to the base member at the channel using one or more fasteners.

2. The fan assembly of claim 1, wherein the first metallic layer extends through an aperture of the second metallic layer from the first side and out towards a distal end of the channel at the second side.

3. The fan assembly of claim 1, wherein the first metallic layer comprises a first metallic material having a first thermal conductivity configured to limit heat buildup in the base member and improve a lifespan of the fan due to heat degradation;

wherein the second metallic layer comprises a second metallic material having a second thermal conductivity configured to thermally conduct heat from a heat spreader; and wherein the second thermal conductivity is higher than the first thermal conductivity.

4. The fan assembly of claim 3, wherein the first metallic layer comprises:

stainless steel;

wherein the first metallic layer is configured to provide structural support to the base member and the fan mounted to the base member at the channel.

5. The fan assembly of claim 4, wherein the second metallic layer comprises:

copper; and wherein the fan is configured to circulate cooling air across a surface of the second metallic layer to dissipate heat buildup in the second metallic layer thermally conducted from the heat spreader to the second metallic layer.

6. The fan assembly of claim 1, wherein the first metallic layer is welded to the second metallic layer.

7. The fan assembly of claim 6, wherein the first metallic layer is laser welded to the second metallic layer.

8. The fan assembly of claim 1, wherein the base member further comprises:

an adhesive, wherein the adhesive is configured to fixedly attach the first metallic layer to the second metallic layer.

9. The fan assembly of claim 8, wherein the adhesive comprises a thermally conductive adhesive.

10. A system for conducting thermal heat from a heat spreader, the system comprising:

a base member comprising:

a first layer located on a first side of the base member, a second layer located on a second side of the base member, wherein the second layer is fixedly attached to the first layer, and a channel extending from the first side to the second side, wherein the channel is configured to be attached to a fan using one or more fasteners;

wherein the second layer of the base member is configured to thermally conduct heat from the heat spreader.

11. The system of claim 10, wherein the first layer comprises:

a stainless-steel material, wherein the first layer comprises a first thermal conductivity configured to limit heat buildup in the first layer to improve a lifespan of the fan due to heat degradation.

12. The system of claim 11, wherein the second layer comprises:

a copper material, wherein the second layer comprises a second thermal conductivity configured to thermally conduct heat from the heat spreader; and wherein the second thermal conductivity is higher than the first thermal conductivity of the first layer to enable thermally conducting heat from the heat spreader.

13. The system of claim 10, wherein the first layer comprises a metallic material configured to provide structural support to the base member and the fan mounted to the base member at the channel.

14. The system of claim 10, further comprising:

a housing assembly, wherein the housing assembly defines a fan chamber, wherein the base member is located in the fan chamber.

15. The system of claim 14, further comprising:

the fan comprising:

a fan motor, wherein the fan motor is rotatably coupled to the base member adjacent the second side at the channel, and a fan blade;

wherein the fan blade is configured to circulate cooling air across a surface of the second layer to dissipate the heat in the second layer built up from the heat spreader.

16. The system of claim 10, wherein the first layer extends through an aperture of the second layer and towards a distal end of the channel at the second side.

17. The system of claim 10, wherein the first layer is laser welded to the second layer.

18. The system of claim 10, wherein the base member further comprises:

an adhesive, wherein the adhesive is configured to fixedly attach the first layer to the second layer.

19. The system of claim 18, wherein the adhesive comprises a thermally conductive adhesive.

* * * * *